US010839741B2

(12) United States Patent
Slobodin

(10) Patent No.: US 10,839,741 B2
(45) Date of Patent: Nov. 17, 2020

(54) DISPLAY AND IMAGE-CAPTURE DEVICE

(71) Applicant: David Elliott Slobodin, Lake Oswego, OR (US)

(72) Inventor: David Elliott Slobodin, Lake Oswego, OR (US)

( * ) Notice: Subject to any disclaimer, the term of this patent is extended or adjusted under 35 U.S.C. 154(b) by 0 days.

(21) Appl. No.: 16/410,208

(22) Filed: May 13, 2019

(65) Prior Publication Data

US 2019/0266939 A1 Aug. 29, 2019

Related U.S. Application Data

(63) Continuation of application No. 15/999,178, filed on Aug. 16, 2018, now Pat. No. 10,290,257.

(60) Provisional application No. 62/633,405, filed on Feb. 21, 2018.

(51) Int. Cl.
| G09G 3/32 | (2016.01) |
| H04N 5/225 | (2006.01) |
| H01L 27/146 | (2006.01) |
| H01L 33/08 | (2010.01) |
| G09G 3/3208 | (2016.01) |
| H01L 25/16 | (2006.01) |
| H01L 25/075 | (2006.01) |

(52) U.S. Cl.
CPC .............. *G09G 3/32* (2013.01); *G09G 3/3208* (2013.01); *H01L 25/167* (2013.01); *H01L 27/14605* (2013.01); *H01L 33/08* (2013.01); *H04N 5/2253* (2013.01); *H04N 5/2254* (2013.01); *H04N 5/22541* (2018.08); *G09G 2360/142* (2013.01); *H01L 25/0753* (2013.01)

(58) Field of Classification Search
CPC .. G09G 3/32; H01L 27/14605; H04N 5/2253; H04N 5/2254; H04N 5/23293
See application file for complete search history.

(56) References Cited

U.S. PATENT DOCUMENTS

| 5,340,978 A | 8/1994 | Rostoker et al. |
| 7,034,866 B1 | 4/2006 | Colmenarez et al. |
| 7,068,254 B2 | 6/2006 | Yamazaki et al. |
| 7,158,129 B2 | 1/2007 | Nakajima |
| 7,535,468 B2 | 5/2009 | Uy |
| 9,057,931 B1 | 6/2015 | Baldwin |
| 10,290,257 B1 * | 5/2019 | Slobodin ........... H01L 27/14605 |

(Continued)

OTHER PUBLICATIONS

Venkataraman et al. of Pelica Imaging Corporation, "PiCam: An Ultra-Thin High Performance Monolithic Camera Array", research article, published Nov. 2013, ACM Transactions on Graphics, vol. 32, No. 6, Article 166.

(Continued)

*Primary Examiner* — Kevin M Nguyen
(74) *Attorney, Agent, or Firm* — Kolitch Romano LLP

(57) ABSTRACT

A display and image-capture device comprises a plurality of image sensors and a plurality of light-emitting elements disposed on a substrate. A plurality of lenses is disposed on a light-incident side of the image sensors, and the lenses are configured to direct light toward the image sensors. The image sensors may be configured to detect directional information of incident light, enabling the device to function as a plenoptic camera. In some examples, the image sensors and lenses are integrated into a plurality of microcameras.

14 Claims, 10 Drawing Sheets

(56) References Cited

U.S. PATENT DOCUMENTS

2012/0307123 A1 12/2012 Cok et al.
2013/0087620 A1* 4/2013 Sharma .............. G06K 19/0614
235/472.01

OTHER PUBLICATIONS

Halloway et al., "Toward Long Distance, Sub-diffraction Imaging Using Coherent Camera Arrays", research article, published Oct. 28, 2015.
Halloway et al., "SAVI: Synthetic apertures for long-range, subdiffraction-limited visible imaging using Fourier ptychography", research article, published Apr. 14, 2017, Science Advances.

* cited by examiner

DISPLAY AND IMAGE-CAPTURE DEVICE

CROSS-REFERENCES

This application claims the benefit under 35 U.S.C. § 119(e) of the priority of U.S. Provisional Patent Application Ser. No. 62/633,405, filed Feb. 21, 2018, the entirety of which is hereby incorporated by reference for all purposes.

FIELD

This disclosure relates to systems and methods for image sensing and display. More specifically, the disclosed embodiments relate to display devices having image-capture functionality.

INTRODUCTION

Display devices configured to show video and/or other digital data are found in a variety of settings, from personal computers to conference rooms and classrooms. In many cases, display devices include image-capture (e.g., camera) functionality, for use in videoconferencing and/or other suitable applications. However, known devices for display and image capture have various disadvantages. In some known devices, the image-sensing components are disposed at edges of the display area. This configuration can result in images that are taken from an undesirable perspective, and can lead to gaze parallax in a videoconferencing setting. In other examples, image-sensing components are integrated into the display area, but this arrangement typically limits display resolution, camera field of view, and/or other performance characteristics.

SUMMARY

The present disclosure provides systems, apparatuses, and methods relating to devices configured for display and image capture. In some embodiments, a display and image-capture device according to aspects of the present teachings may include a substrate generally defining a plane; a plurality of electrical conductors disposed on the substrate; a plurality of image sensor dies disposed on the substrate, each image sensor die including a photosensor region; a plurality of light emitting dies disposed on the substrate, each light emitting die including a light emitting region; at least one electronic controller configured, through the electrical conductors, to transmit mode signals to the image sensor dies, receive image data from the image sensor dies, and transmit display signals to the light emitting dies; and a power source configured, through the electrical conductors, to provide the power to the image sensor dies and the light emitting dies.

In some embodiments, a display and image-capture device according to aspects of the present teachings may comprise a substrate generally defining a plane; a plurality of image sensor dies disposed on the substrate, each image sensor die including a photosensor region; a plurality of lenses disposed on a light-incident side of the image sensor dies, wherein each of the lenses is configured to direct light impinging on a front surface of the lens toward a predetermined one of the photosensor regions based on an angle of incidence between the impinging light and the front surface of the lens; a plurality of light emitting dies disposed on the substrate, each light emitting die including a light emitting region; and at least one electronic controller configured to transmit mode information to the image sensor dies, receive image data from the image sensor dies, and transmit display signals to the light emitting dies.

In some embodiments, a camera display system according to aspects of the present teachings may comprise a substrate generally defining a plane; a plurality of micro-cameras disposed on the substrate, each of the micro-cameras including an image sensor and a lens configured to direct incident light onto the image sensor; an array of light-emitting elements disposed on the substrate; a substantially optically transparent protective layer overlying the micro-cameras and the light-emitting elements; and at least one electronic controller configured to receive image data from the incident light and transmit display signals to the light-emitting elements.

Features, functions, and advantages of the present teachings may be achieved independently in various embodiments of the present disclosure, or may be combined in yet other embodiments, further details of which can be seen with reference to the following description and drawings.

DETAILED DESCRIPTION

Figure 1:
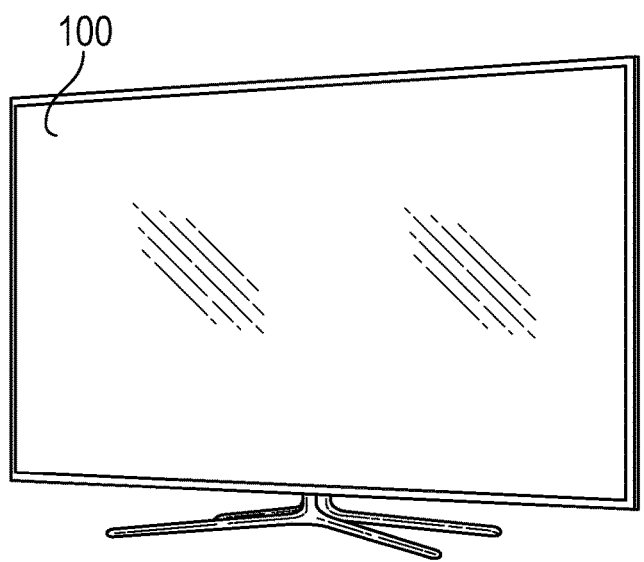
FIG. 1 is an isometric view of an illustrative display and image-capture device in accordance with aspects of the present disclosure.

Various aspects and examples of a device having display and image capture functionality are described below and illustrated in the associated drawings. Unless otherwise specified, a display and image capture device in accordance with the present teachings, and/or its various components may, but are not required to, contain at least one of the structures, components, functionalities, and/or variations described, illustrated, and/or incorporated herein. Furthermore, unless specifically excluded, the process steps, structures, components, functionalities, and/or variations described, illustrated, and/or incorporated herein in connection with the present teachings may be included in other similar devices and methods, including being interchangeable between disclosed embodiments. The following description of various examples is merely illustrative in nature and is in no way intended to limit the disclosure, its application, or uses. Additionally, the advantages provided by the examples and embodiments described below are illustrative in nature and not all examples and embodiments provide the same advantages or the same degree of advantages.

This Detailed Description includes the following sections, which follow immediately below: (1) Definitions; (2) Overview; (3) Examples, Components, and Alternatives; (4) Illustrative Combinations and Additional Examples; (5) Advantages, Features, and Benefits; and (6) Conclusion. The Examples, Components, and Alternatives section is further divided into subsections A through F, each of which is labeled accordingly.

Definitions

The following definitions apply herein, unless otherwise indicated.

"Substantially" means to be more-or-less conforming to the particular dimension, range, shape, concept, or other aspect modified by the term, such that a feature or component need not conform exactly. For example, a "substantially cylindrical" object means that the object resembles a cylinder, but may have one or more deviations from a true cylinder.

"Comprising," "including," and "having" (and conjugations thereof) are used interchangeably to mean including but not necessarily limited to, and are open-ended terms not intended to exclude additional, unrecited elements or method steps.

Terms such as "first", "second", and "third" are used to distinguish or identify various members of a group, or the like, and are not intended to show serial or numerical limitation.

"AKA" means "also known as," and may be used to indicate an alternative or corresponding term for a given element or elements.

Overview

In general, a display and image-capture device in accordance with the present teachings may include a substrate, a plurality of light-emitting dies disposed on the substrate, and a plurality of image-sensor dies disposed on the substrate. Each light-emitting die may include a light-emitting region configured to emit light in response to an electrical signal, and each image-sensor die may include a photosensor region configured to produce electrical signals (e.g., image data) in response to incident light. The light-emitting dies and image-sensor dies may each be distributed on the substrate to provide integrated display and image-capture functions. In some cases, a plurality of lenses may be disposed on a light-incident side of the image-sensor dies to direct light toward predetermined photosensor regions, or predetermined portions of photosensor regions.

A plurality of electrical conductors may be disposed on the substrate to connect the light-emitting dies and the image-sensor dies to an electronic controller and/or to a power source. Via the electrical conductors, the electronic controller may transmit display signals to the light-emitting dies and receive image data from the image-sensor dies. In some examples, the image data is processed by processing circuits associated with the image-sensor dies prior to being transmitted to the electronic controller.

In some examples, the electronic controller may transmit display signals directly to the light emitting dies, and in other examples, the electronic controller may transmit display signals to one or more transistors, which switch and/or regulate current flow to the light emitting dies. Such transistors are typically thin film transistors, and may be formed from the same material (e.g., gallium nitride, or GaN) as the light emitting dies. A system that uses transistors in this manner, i.e., to switch and/or regulate current flow between the electronic controller and the light emitting dies, may be described as an "active matrix" system. Phrases such as "transmit display signals to the light emitting dies" as used herein are intended to cover both direct transmission of display signals to the light emitting dies, and indirect transmission through transistors, in an active matrix manner.

The electronic controller may also transmit to the image-sensor dies, and/or to the associated processing circuits, command signals configured to determine a mode of operation of the image-sensor dies. The command signals may be configured to adjust one or more image-capture characteristics of the image-sensor dies, and/or of the entire device, by selectively processing and/or discarding image data corresponding to selected portions of the photosensor regions. Characteristics that may be adjustable by selectively processing data from portions of the photosensor regions may include field of view, depth of field, effective aperture size, focal distance, and/or any other suitable characteristic.

Additionally, or alternatively, the command signals may include a mode signal configured to switch the image-sensor dies between a two-dimensional (AKA "conventional") image-sensing mode and a three-dimensional (AKA "plenoptic", "light-field", or "depth-sensing") image-sensing mode. The plenoptic functionality may be enabled by reading image data from substantially the entirety of each photosensor region simultaneously, or nearly simultaneously. This data, in conjunction with a model of any lenses and/or other optical elements on a light-incident side of the image-sensor dies, may be used to obtain a directional distribution of the incident light, and thus enables light-field effects such as refocusing, noise reduction, and/or the like.

Examples, Components, and Alternatives

The following sections describe selected aspects of exemplary display and image-capture devices, as well as related systems and/or methods. The examples in these sections are intended for illustration and should not be interpreted as limiting the entire scope of the present disclosure. Each section may include one or more distinct embodiments or examples, and/or contextual or related information, function, and/or structure.

A. Illustrative Display and Image-Capture Device

This section describes an illustrative device 100, shown in FIGS. 1-11. Device 100 is an example of a display and image-capture device in accordance with the present teachings, as described above.

FIG. 1 depicts illustrative device 100. Device 100 may comprise, or be integrated into, a monitor, television, computer, mobile device, tablet, interactive display, and/or any other suitable device. Device 100 may be configured to be rigid, flexible, and/or foldable, depending on the specific implementation. In the example depicted in FIG. 1, device 100 is planar (e.g., comprises a flat-panel device), but device 100 may alternatively, or additionally, comprise one or more curved and/or folded portions.

Figure 2:
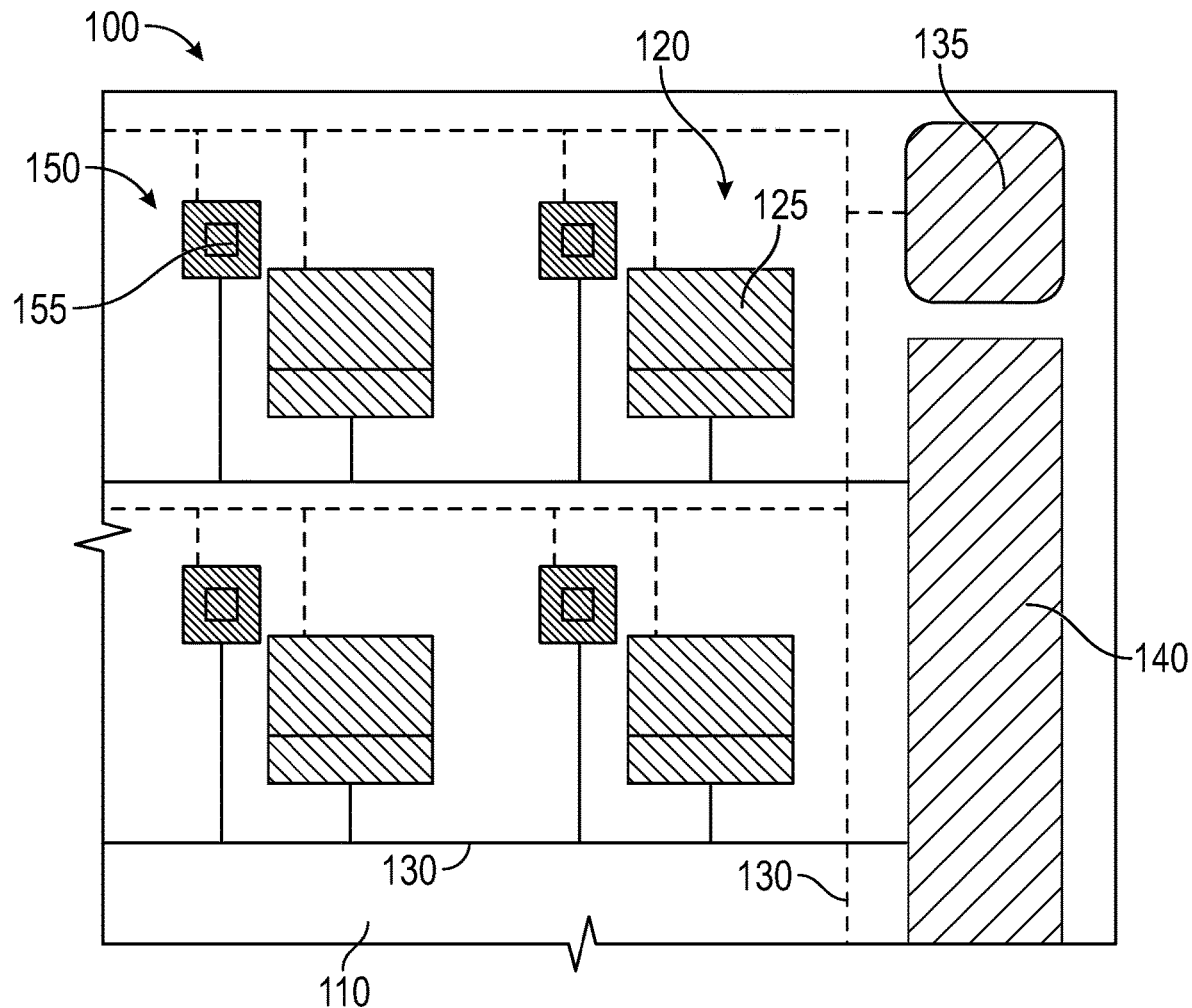
FIG. 2 is a schematic partial top view of an illustrative substrate of the device of FIG. 1.

FIG. 2 is a partial top view depicting a portion of device 100. Device 100 includes a substrate 110 generally defining a plane. Substrate 110 can comprise glass, plastic, metal, and/or any other suitable materials. Substrate 110 may be monolithic, or may comprise a plurality of discrete substrate portions joined together.

A plurality of image-sensor dies 120 are disposed on substrate 110. Each image-sensor die 120 includes a photosensor region 125 configured to produce an electrical signal in response to impinging light. For example, the electrical signal may comprise a digital and/or analog value (e.g., a voltage level) that depends on the intensity of the impinging light. The electrical signal comprises data representing a scene imaged by device 100 and accordingly may be referred to as image data. Photosensor region 125 may comprise a CMOS sensor, CCD sensor, photodiode, and/or the like. Image-sensor die 120 may further comprise a casing structure configured to support and/or protect photosensor region 125, to facilitate electrical connections to the photosensor region, and/or to dissipate heat.

Electrical conductors 130 disposed on substrate 110 are configured to route power from a power source 135 to image-sensor dies 120, and to transmit image data from image-sensor dies 120 to an electronic controller 140. Electrical conductors 130 may include any suitable electrically conductive material, and may comprise wires, cables, ribbons, traces, and/or any other suitable structure. Electrical conductors 130 may be disposed on a surface of substrate 110, and/or may be embedded within the substrate. In some examples, the conductors may be optical rather than electrical.

Power source 135 may comprise any suitable device configured to provide electrical power via electrical conductors 130. In some examples, power source 135 comprises a power supply unit configured to receive mains power (e.g., from an electrical grid of a building) and, if necessary, to convert the received power into a form usable by device 100. Alternatively, or additionally, power source 135 may comprise one or more batteries and/or other suitable power storage devices.

Substrate 110 further includes a plurality of light-emitting dies 150. Each light-emitting die 150 has a respective light-emitting region 155, and may additionally include a casing structure as described above with reference to image-sensor dies 120. Light-emitting dies 150 are configured to produce light in response to an electrical display signal provided by electronic controller 140. For example, light-emitting dies 150 may each include one or more microLEDs (AKA mLEDS or pLEDs), OLEDs, and/or the like. Light-emitting dies 150 may further include color-conversion devices configured to convert the color of the light emitted by, e.g., a microLED, to a desired color. In some examples, each light-emitting die 150 includes three light-emitting regions 155 configured to output red, green, and blue light respectively (i.e., RGB sub-pixels). Electrical conductors 130 transmit to light-emitting dies 150 a display signal from electronic controller 140 and power from power source 135.

Light-emitting regions 155 comprise display pixels of the display system of device 100, and photosensor regions 125 comprise input pixels of the image-capture system of device 100. Accordingly, light-emitting dies 150 and image-sensor dies 120 are arranged on substrate 110 in a manner configured for displaying and capturing images with suitable pixel resolution. For example, light-emitting dies 150 and image-sensor dies 120 may be distributed in a regular pattern across the entirety, or the majority, of substrate 110. In some examples, portions of substrate 110 include light-emitting dies 150 but no image-sensor dies 120, or vice versa. For example, image-sensor dies 120 may be included in central portions of substrate 110 but omitted from edge portions of the substrate.

In the example shown in FIG. 2, light-emitting dies 150 and image-sensor dies 120 are collocated on substrate 110, with a light-emitting die positioned near each image-sensor die. That is, light-emitting dies 150 and image-sensor dies 120 are distributed on substrate 110 in a one-to-one ratio. In other examples, however, device 100 includes more light-emitting dies 150 than image-sensor dies 120, or vice versa. The ratio may be selected based on, e.g., the display pixel resolution and/or image-capture pixel resolution required for a specific implementation of device 100, on a desired processing speed and/or capacity of device 100, on the number of electrical conductors 130 that can fit on substrate 110, and/or on any other suitable factors.

Figure 3:
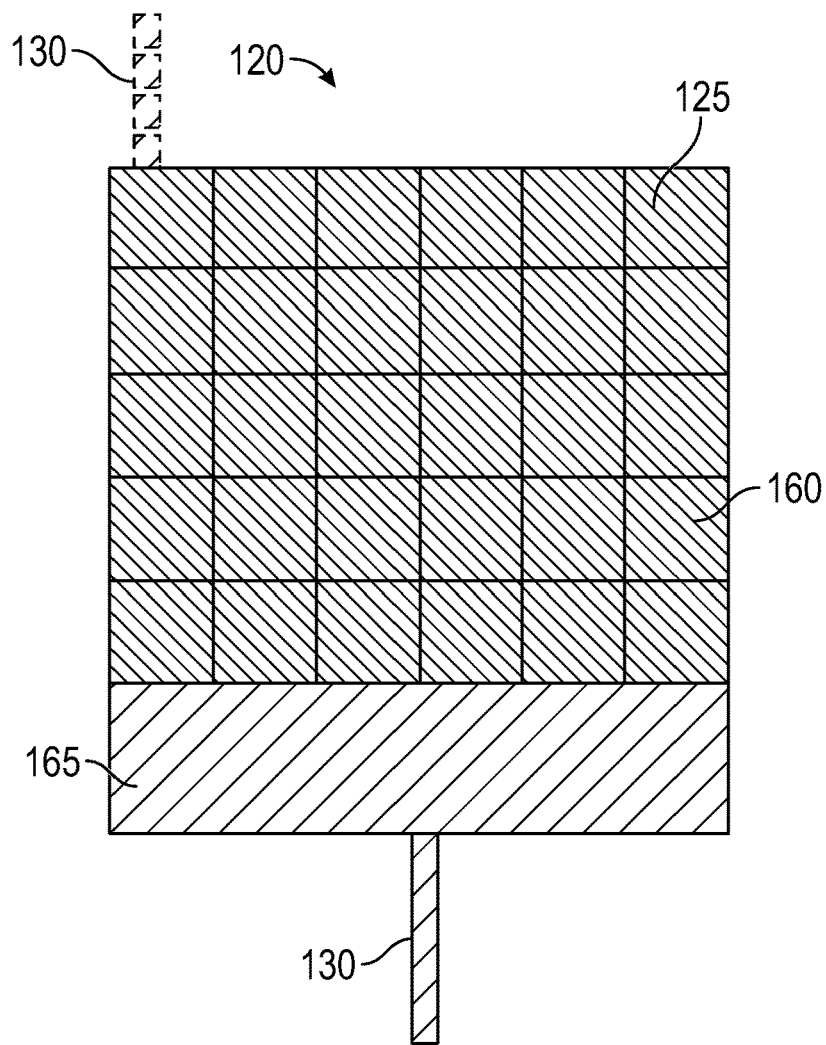
FIG. 3 is a schematic top view of an illustrative image-sensor die in accordance with aspects of the present disclosure.

FIG. 3 schematically depicts an illustrative image-sensor die 120 in more detail. In this example, photosensor region 125 of image-sensor die 120 includes a plurality of image-sensing pixels 160 arranged in a two-dimensional array. For example, photosensor region 125 may comprise a CCD array and/or a CMOS array.

Illustrative image-sensor die 120 further includes a processing circuit 165 configured to receive and process image data from photosensor region 125, and to transmit the processed image data to electronic controller 140. Processing the image data may include discarding a portion of the image data, compressing the data, converting the data to a new format, and/or performing image-processing operations on the data. Image-processing operations may include noise reduction, color processing, image sharpening, and/or the like.

Processing circuit 165, which may also be referred to as processing logic, may include any suitable device or hardware configured to process data by performing one or more logical and/or arithmetic operations (e.g., executing coded instructions). For example, processing circuit 165 may include one or more processors (e.g., central processing units (CPUs) and/or graphics processing units (GPUs)), microprocessors, clusters of processing cores, FPGAs (field-programmable gate arrays), artificial intelligence (AI) accelerators, digital signal processors (DSPs), and/or any other suitable combination of logic hardware.

In the example shown in FIG. 3, processing circuit 165 is included in image-sensor die 120. In other examples, however, processing circuit 165 may be disposed on substrate 110 separately from image-sensor die 120. Additionally, or alternatively, each processing circuit may receive and process data from several image-sensor dies.

Figure 4:
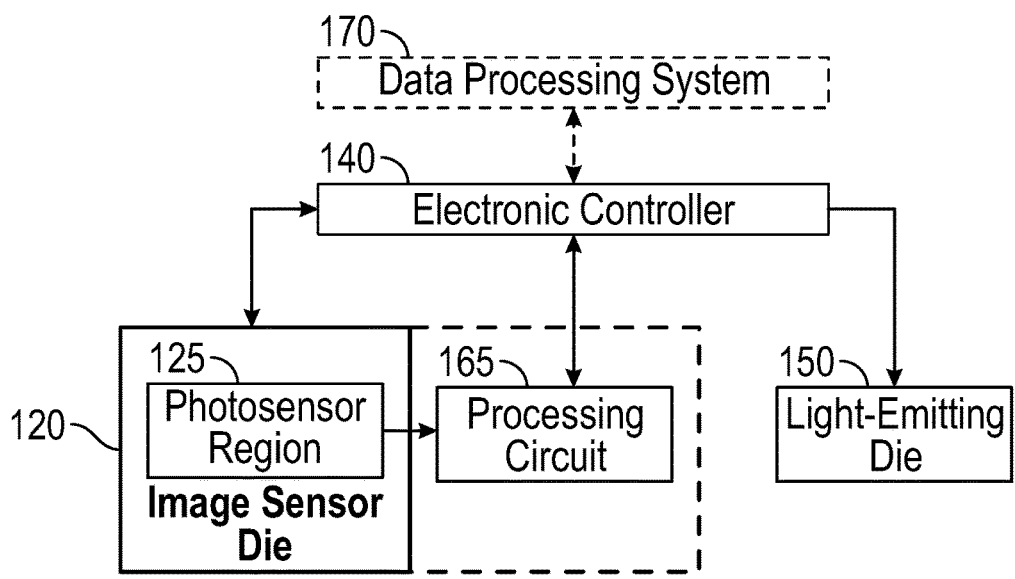
FIG. 4 is a schematic diagram depicting the flow of data within a display and image-capture device, in accordance with aspects of the present disclosure.

FIG. 4 schematically depicts data flow within device 100. Electronic controller 140 is configured to transmit display signals to light-emitting die 150. The display signals are configured to cause light-emitting region 155 to emit light with a selected intensity and, if appropriate, color.

Electronic controller 140 is further configured to transmit mode signals and/or other commands to image-sensor die 120, and to receive image data from the image-sensor die. In examples including processing circuit 165, electronic controller 140 may transmit mode signals to the processing circuit, which may receive image data from photosensor region 125, process the data in accordance with a mode specified by the mode signal, and transmit the processed data to the electronic controller. However, electronic controller 140 may additionally or alternatively be configured to transmit command signals to and/or receive data from a portion of the image sensor die that is not processing circuit 165.

In some examples, electronic controller 140 is connected to at least one data processing system 170, also referred to as a computer, computer system, or computing system. Data processing system 170 typically runs one or more applications related to device 100, such as a videoconferencing application, game, virtual reality and/or augmented reality application, and/or any other application configured to use the display and/or image capture functions of device 100. Data processing system 170 may provide instructions to electronic controller 140 to transmit display signals to light-emitting dies 150 corresponding to a desired image (e.g., a video frame received by a videoconferencing application). Additionally, or alternatively, data processing system 170 may provide instructions related to the image-capture function of device 100. Data processing system 170 may include an interface configured to allow users to adjust settings related to display and/or image-capture functions of device 100.

Figure 5:
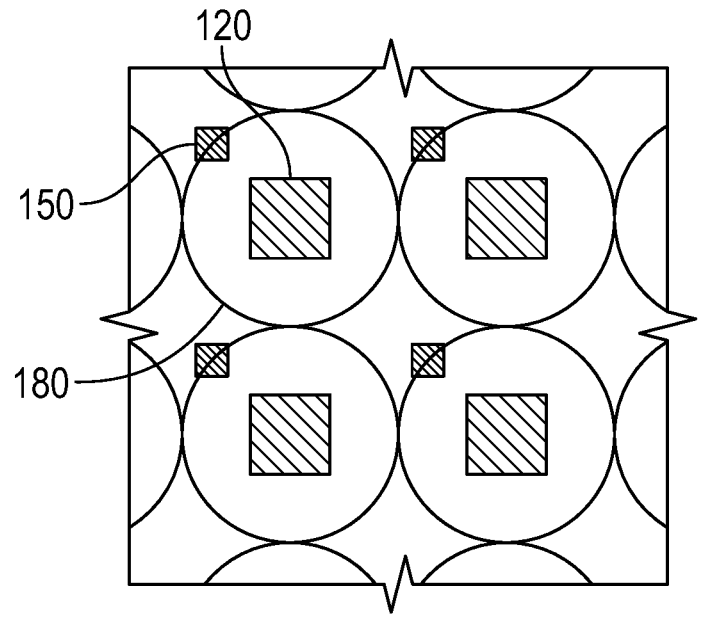
FIG. 5 is a schematic partial top view depicting a plurality of lenses disposed over the substrate of FIG. 2.
Figure 6:
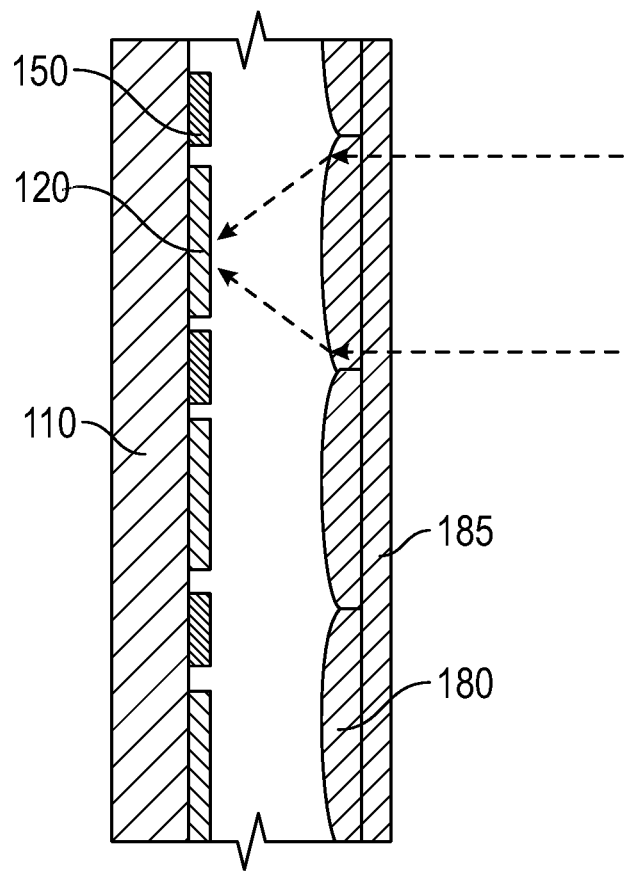
FIG. 6 is a schematic partial side view of a display and image-capture device incorporating the substrate and lenses of FIG. 5.

As shown in FIGS. 5-6, device 100 may further include a plurality of lenses 180 disposed on a light-incident side of image-sensor dies 120. In the example shown in FIGS. 5-6, a respective one of lenses 180 is disposed on a light-incident side of each image-sensor die 120, and each lens is configured to focus light on or toward photosensor region 125 of the corresponding image-sensor die. In other examples, each lens 180 may be configured to focus light on any one of several image-sensor dies 120 based on an angle of incidence of the light. (See, for example, FIG. 12 and associated description.) Typically, in these examples, lenses 180 and image-sensor dies 120 are arranged such that each image-sensor die receives light from only one lens.

Lenses 180 may comprise convex lenses, plano-convex lenses, achromatic lenses (e.g., achromatic doublets or triplets), aspheric lenses, and/or any other suitable type of lens. In some examples, lenses 180 comprise a plurality of microlenses disposed on a microlens substrate (e.g., a microlens array).

A protective layer 185 may be disposed on a light-incident side of lenses 180 to protect the lenses and other components of device 100. Protective layer 185 is typically substantially optically transparent and may include one or more coatings or other components configured to be scratch-resistant, water-resistant, anti-reflective, anti-glare, anti-friction, and/or to have any other suitable properties.

In some examples, an air gap extends between lenses 180 and image-sensor dies 120. Alternatively, the gap, or portions thereof, may be at least partially filled with a material having suitable optical properties. For example, the gap may include material having a refractive index substantially equal to a refractive index of lenses 180, and/or a refractive index of a microlens substrate supporting lenses 180. Optical properties of any material positioned within the gap may be configured to facilitate outcoupling of light emitted by light-emitting dies 150, i.e., to increase the amount of emitted light emitted toward a viewer.

Figure 7:
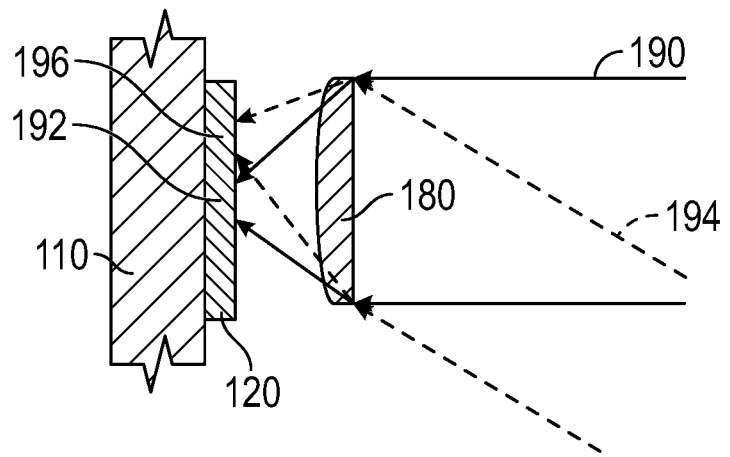
FIG. 7 is a schematic partial side view depicting incident light impinging on the lenses of FIG. 5 from different directions.

Depending on the properties of lens 180 and the size of photosensor region 125, the spot size of light focused by the lens toward the photosensor region may be smaller than the photosensor region. In this case, only a portion of photosensor region 125 is impinged upon by the light. The impinged-upon portion is typically determined by a direction of the incident light, e.g., an angle of incidence between the light and lens 180. FIG. 7 depicts a first portion of light, indicated at 190, impinging upon lens 180 at a 90° angle (e.g., a 0° angle of incidence relative to an axis normal to the surface of the lens). First portion of light 190 is focused onto a first photosensor portion 192. Second portion of light 194 impinges on lens 180 from a different direction and is therefore focused onto a second photosensor portion 196.

Figure 8:
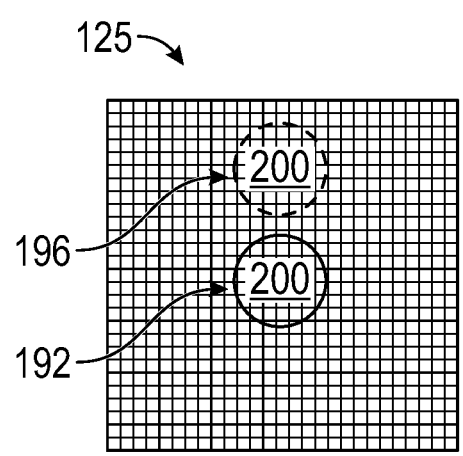
FIG. 8 is a schematic top view depicting regions of an illustrative image-sensor die receiving light incident from the directions depicted in FIG. 7.

As shown in FIG. 8, in examples in which photosensor region 125 includes an array of image-sensing pixels 160, the photosensor portion impinged upon by light passing through lens 180 comprises a subset of the image-sensing pixels. The relationship between the position of an image-sensing pixel 160 on photosensor region 125 and the incident angle between lens 180 and the impinging light detectable by the pixel is determined at least partially by optical properties of the lens, such as focal length, f-number, diameter, curvature, and/or the like. Due to this relationship, directional information (e.g., radiance) about detected light can be inferred based on which pixels 160 detected the light. Accordingly, device 100 is capable of functioning as a plenoptic camera. For example, processing circuit 165 may be configured to process and transmit image data measured by a selected subset 200 of image-sensing pixels 160. Subset 200 may correspond to, e.g., a desired direction and/or acceptance angle of light to be measured. FIG. 8 shows the subsets 200 of pixels 160 that measure data associated with first portion of light 190 (at first photosensor portion 192) and second portion of light 194 (at second photosensor portion 196).

The position and/or extent of subset 200 may at least partially determine the field of view, effective aperture, focal distance, and/or depth of field of the optical system formed by photosensor region 125 and the corresponding lens 180. For example, the effective aperture size and field of view may be increased by increasing the number of pixels 160 in subset 200.

Figure 9:
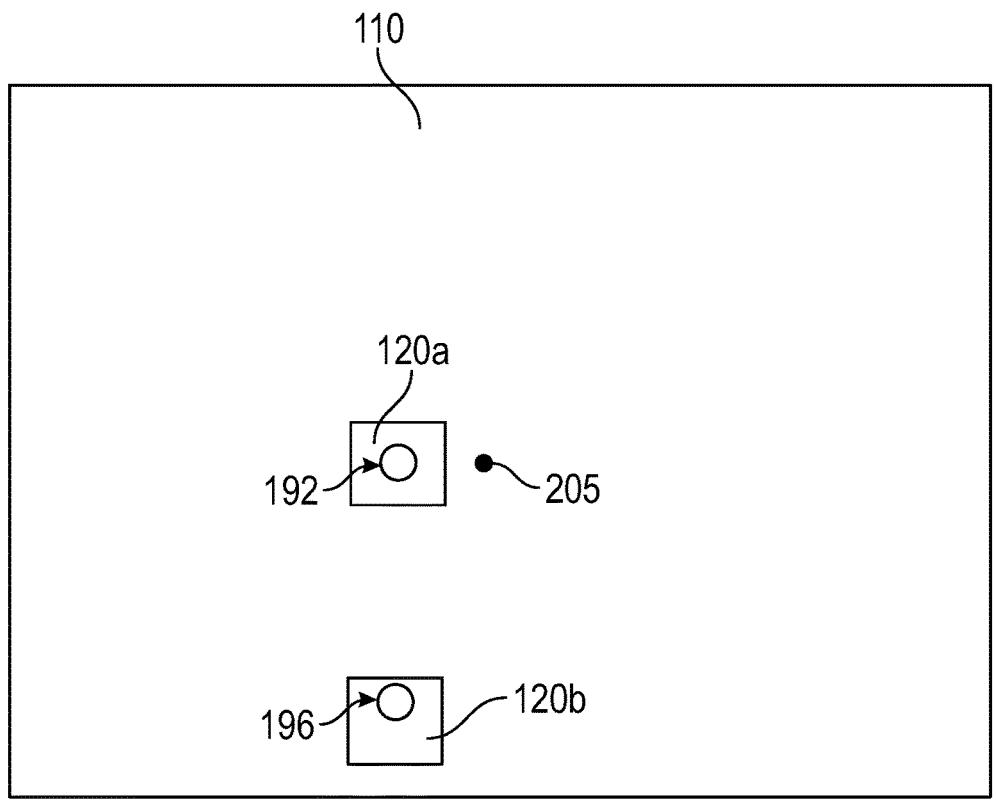
FIG. 9 is a schematic top view depicting illustrative image-sensor dies disposed at different locations on a device substrate.

The selection of subset 200 for each image-sensor die 120 may depend on a location of the image-sensor die on substrate 110. In other words, the position and extent of subset 200 on photosensor region 125 may be selected based on the position of the associated image-sensor die 120. FIG. 9 schematically depicts illustrative image-sensor dies 120a and 120b disposed at different locations on substrate 110. Die 120a is positioned near a central point 205 of substrate 110, and die 120b is positioned near an edge of the substrate, far from the central point. Subset 200 of die 120a is positioned at a central portion of photosensor region 125, corresponding to photosensor portion 192 shown in FIGS. 7-8. Subset 200 of die 120*b* is positioned at an edge portion of photosensor region 125, corresponding to photosensor portion 196 shown in FIGS. 7-8. Specifically, die 120*b* is positioned near a bottom edge of substrate 110, and the corresponding subset 200 is positioned near a top edge of associated photosensor region 125. This configuration extends the field of view of device 100 beyond the bottom edge of substrate 110, enabling the device to receive light from objects that would otherwise lie outside the field of view. In some examples, processing circuits 165 corresponding to all image-sensor dies 120 disposed near edges of substrate 110 are configured to read data from subset 200 positioned such that the field of view of device 100 is increased by a predetermined amount.

Alternatively, or additionally, processing circuit 165 may be configured to receive and process data from substantially the entirety of photosensor region 125 and to send the entire set of processed data to electronic controller 140. Electronic controller 140 and/or associated data processing system 170 may be configured to process selected subsets of the image data corresponding to data originally recorded by selected pixel subsets. In this way, the focal distance, depth of view, effective aperture size, field of view, and/or any other suitable property of an image captured by device 100 can be adjusted after the image data has been received. Image processing may be performed on the set of data corresponding to substantially the entirety of photosensor region 125 of some or all image-sensor dies 120.

Figure 10:
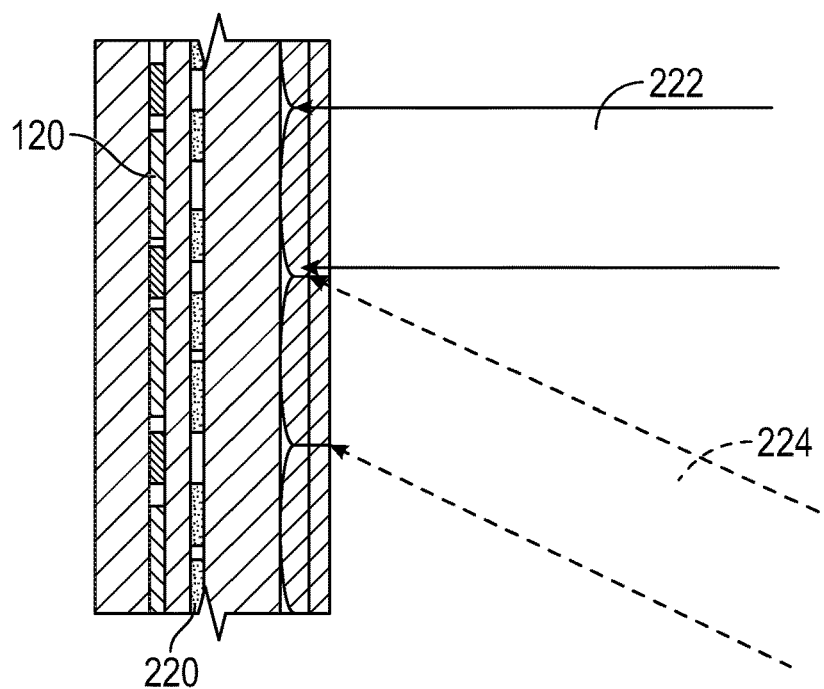
FIG. 10 is a schematic partial side view depicting an illustrative field-stop layer of a display and image-capture device, in accordance with aspects of the present disclosure.

FIG. 10 depicts an illustrative field-stop layer 220 disposed between lenses 180 and image-sensor dies 120. Field-stop layer 220, according to aspects of the present teachings, includes a patterned mask configured to prevent light focused by each lens from reaching any photosensor region 125 other than the photosensor region associated with the lens. In examples in which each lens 180 is associated with exactly one photosensor region 125, field stop layer 220 is configured to prevent each photosensor region from receiving light from more than one lens 180. FIG. 10 depicts an illustrative accepted light portion 222 that passes through an opening in field-stop layer 220 and is focused onto image-sensor die 120, as well as a blocked light portion 224 that is prevented by field-stop layer 220 from reaching the same image-sensor die. Field-stop layer 220 helps to facilitate the measurement of directional information by device 100 by preventing light from several different directions from impinging on a same pixel subset 200.

Figure 11:
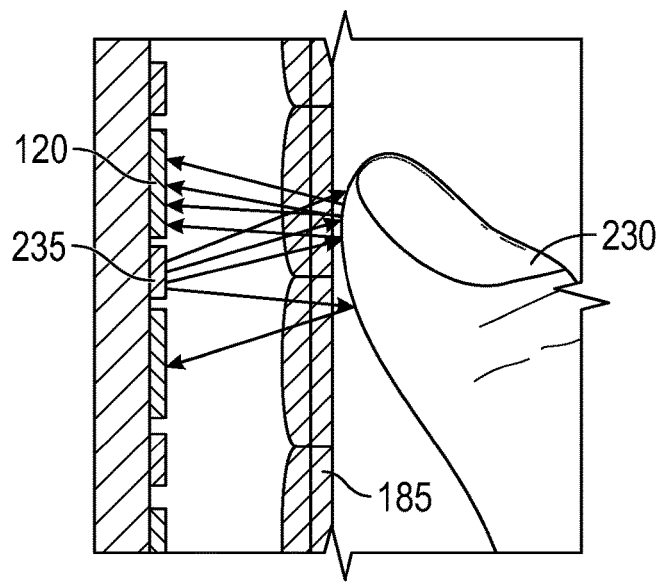
FIG. 11 is a schematic partial side view depicting an illustrative touch-sensitive display and image-capture device, in accordance with aspects of the present disclosure.

FIG. 11 depicts an illustrative example in which device 100 is configured to be touch-sensitive, e.g., to detect a touch object 230. Touch object 230 may comprise a user's hand, a stylus, and/or any other suitable object contacting or nearly contacting a front surface of the device, such as protective layer 185. In this example, image-sensor dies 120 are configured to detect light reflected from touch object 230 and to transmit the data to electronic controller 140. Electronic controller 140 and/or data processing system 170 is configured to determine information about touch object 230 based on the received data. Determining information about touch object 230 may include, e.g., calculating a centroid of the reflected light, and/or analyzing a shape of the area from which the light is reflected. Based on the determined information, device 100 recognizes that touch object 230 is contacting (or hovering over) the device, and responds accordingly. For example, an application running on data processing system 170 may display interactive objects on device 100 using light-emitting dies 150, and a user may interact with the objects using touch object 230. Additionally, or alternatively, display and/or image-capture settings of device 100 may be adjustable using touch object 230.

In some examples, the light reflected from touch object 230 and received by image-sensor dies 120 is light originally emitted by light-emitting dies 150 for display purposes. Alternatively, or additionally, secondary light-emitting dies 235 may be disposed on substrate 110 and configured to emit light to be reflected from touch object 230. Secondary light-emitting dies 235 typically emit light that is configured to be readily distinguishable from light emitted by light-emitting dies 150. In some examples, secondary light-emitting dies 235 emit light having a longer wavelength than the light emitted by light-emitting dies 150. For example, light-emitting dies 150 may emit light that lies predominantly within the visible spectrum, and secondary light-emitting dies 235 may emit infrared light. The reflected infrared light may be detected with a better signal-to-noise ratio than light emitted by light-emitting dies 150. In some examples, secondary light-emitting dies 235 may be powered off or otherwise disabled when not in use.

Electronic controller 140 may be configured to determine a mode of operation of device 100 by sending suitable electrical signals to at least some light-emitting dies 150, image-sensing dies 120, secondary light-emitting dies 235, processing circuits 165, and/or any other suitable device components. For example, electronic controller 140 may switch device 100 into a touch-sensitive mode of operation by sending to secondary light-emitting dies 235 a signal configured to activate the secondary light-emitting dies. Additionally, or alternatively, electronic controller 140 may switch device 100 into a plenoptic-camera mode by sending to processing circuits 165 a signal configured to cause the processing circuits to receive, process, and transmit data from a large portion of the associated photosensor regions 125 (e.g., a portion corresponding to light impinging on associated lens 180 from a large range of directions). Additionally, or alternatively, electronic controller 140 may switch device 100 into a two-dimensional or conventional camera mode by sending to processing circuits 165 a signal configured to cause the processing circuits to receive, process, and transmit data from only a selected subset 200 of associated photosensor regions 125. In the conventional camera mode, directional information is typically not included in the image data, but the volume of data processed and transmitted may be smaller, which may allow for faster device operations (e.g., a faster video frame rate).

In some examples, the field of view of device 100 is at least partially determined by the relative position between each lens 180 and the image-sensor die or dies 120 onto which each lens focuses light. For example, lenses 180 disposed near middle portions of substrate 110 may be centered above the corresponding image-sensor dies 120, and lenses near edge portions of the substrate may be positioned away from the centers of the corresponding image-sensor dies (e.g., they may be decentered). Additionally, or alternatively, lenses 180 may have a different shape (e.g., a different surface profile) based on their distance from central point 205 of substrate 110. This configuration may extend the field of view of device 100 and/or improve the imaging resolution of the device by preventing field-curvature effects that might otherwise occur at edges of the device's field of view.

In some examples, substrate 110 comprises a plurality of zones, and image-sensor dies 120 and lenses 180 within a same zone are configured to have a same field of view and/or a same effective aperture.

In some examples, image-sensor dies 120 are distributed across only a portion of substrate 110, so that only a portion of device 100 has image-capture functionality. Additionally, or alternatively, light-emitting dies 150 may be distributed across only a portion of substrate 110, so that only a portion of device 100 has display functionality. Limiting image-sensor dies 120 and/or light-emitting dies 150 to a portion of substrate 110 may lower the manufacture cost and/or power consumption of the device.

B. Second Illustrative Example

Figure 12:
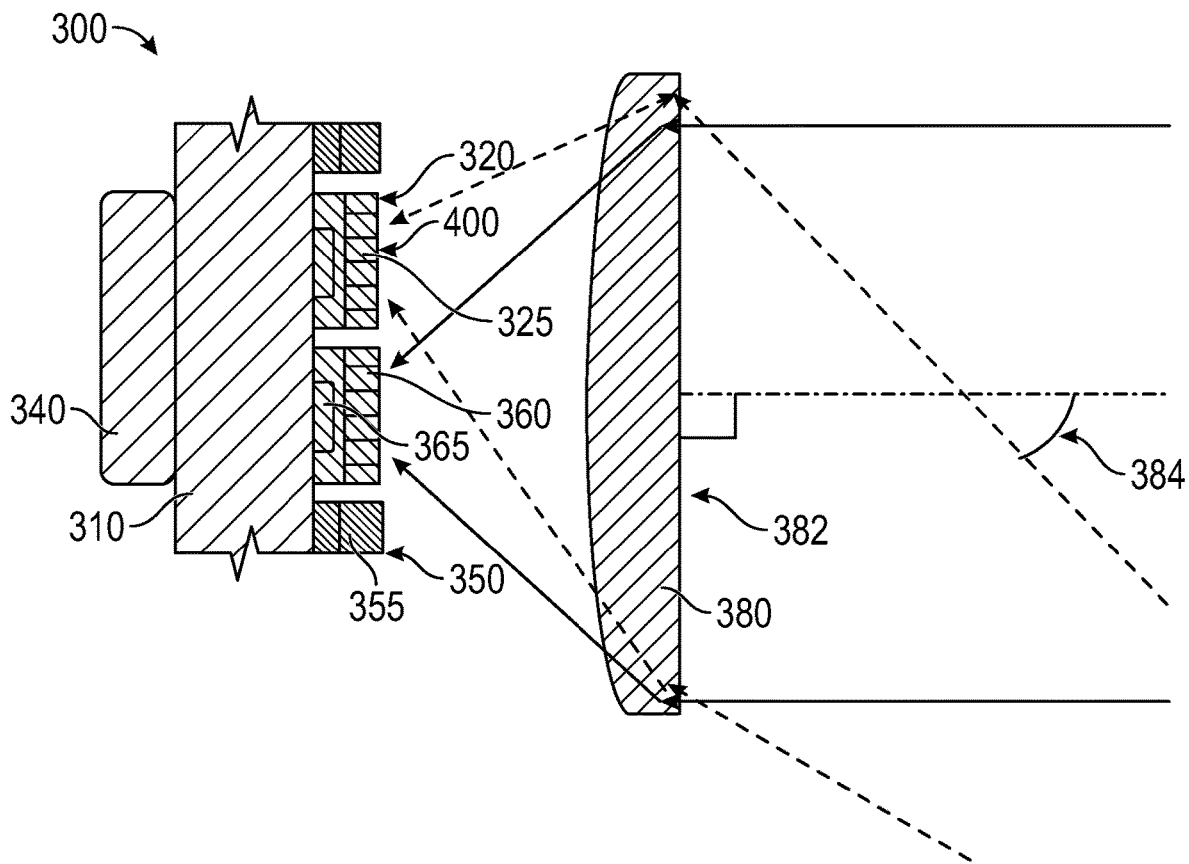
FIG. 12 is a schematic partial side view of another illustrative display and image-capture device, in accordance with aspects of the present disclosure.

This section describes another illustrative device 300 configured for display and image capture according to the present teachings. Device 300 is substantially similar in some respects to device 100, described above. Accordingly, as shown in FIG. 12, device 300 includes a substrate 310 and a plurality of image-sensor dies 320 disposed on the substrate, each image-sensor die having a photosensor region 325. Device 300 further includes an electronic controller 340 and a plurality of light-emitting dies 350 disposed on the substrate, each light-emitting die having a light-emitting region 355. Electronic controller 340 is configured to transmit mode information to image-sensor dies 320, to receive image data from the image-sensor dies, and to transmit display signals to light-emitting dies 350. Each photosensor region 325 may comprise a two-dimensional array of pixels 360, depicted in side view in FIG. 12. Processing circuits 365 may be disposed on the substrate, and/or included in image-sensor dies 320. Processing circuits 365 are configured to receive image data from pixels 360, to process the image data, and to transmit the processed image data to electronic controller 340.

Device 300 further includes a plurality of lenses 380 disposed on a light-incident side of image-sensor dies 320. Lenses 380 are each configured to direct light impinging on a front surface 382 of the lens toward a predetermined one of photosensor regions 325 based on an angle of incidence 384 between the impinging light and the front surface of the lens. In contrast, lenses 180 of device 100 are each configured to focus incident light on one of photosensor regions 125, and the incident light may be directed toward a predetermined portion of the photosensor region based on the angle of incidence between the light and the lens. Accordingly, device 100 is configured to obtain directional information about incident light based on which portion of photosensor region 125 detects the light, and device 300 is configured to obtain directional information about incident light based on which photosensor region 325 detects the light. However, device 300 may obtain additional directional information based on which portion of photosensor region 325 detects the light.

As described above with reference to device 100, processing circuits 365 of device 300 may be configured to selectively process and transmit image data corresponding to only a subset 400 of pixels 360. Processing and transmitting image data from only subset 400 may, for example, effectively determine an effective aperture size and/or field of view for the imaging system comprising lens 380 and the associated image-sensor dies 320.

Figure 13:
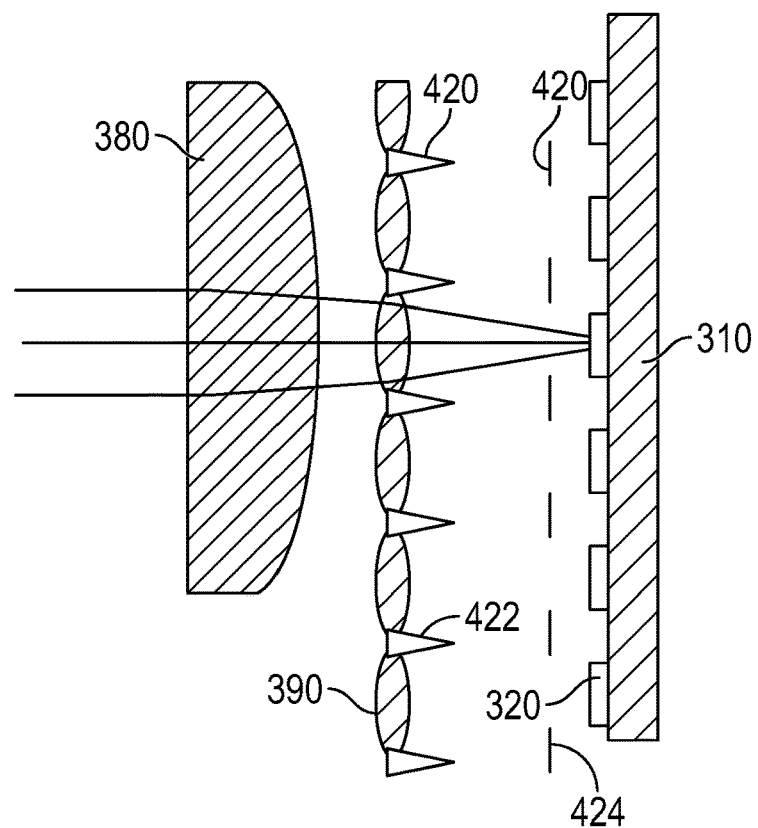
FIG. 13 is a schematic partial side view depicting a field-stop layer and a plurality of microlenses in the device of FIG. 12.

Device 300 may further include a plurality of microlenses 390, as shown in FIG. 13. Microlenses 390 are disposed on a light-incident side of each image-sensor die 320 (e.g., between the image-sensor die and lens 380) and are configured to focus incident light on photosensor region 325 of the image-sensor die. Microlenses 390 may comprise a microlens array layer.

A field-stop layer 420 may be disposed between microlenses 390 and image-sensor dies 320 to inhibit light focused by each microlens from reaching more than one of the photosensor regions 325. In the example depicted in FIG. 13, field-stop layer 420 includes field-stop barriers 422 disposed between adjacent microlenses 390 and extending toward substrate 310, and further includes a mask layer 424 disposed between the field-stop barriers and the substrate. In some examples, microlenses 390 comprise a microlens array formed on an array substrate, and field-stop barriers 422 are part of the array substrate.

C. Illustrative Microcamera Device

Figure 14:
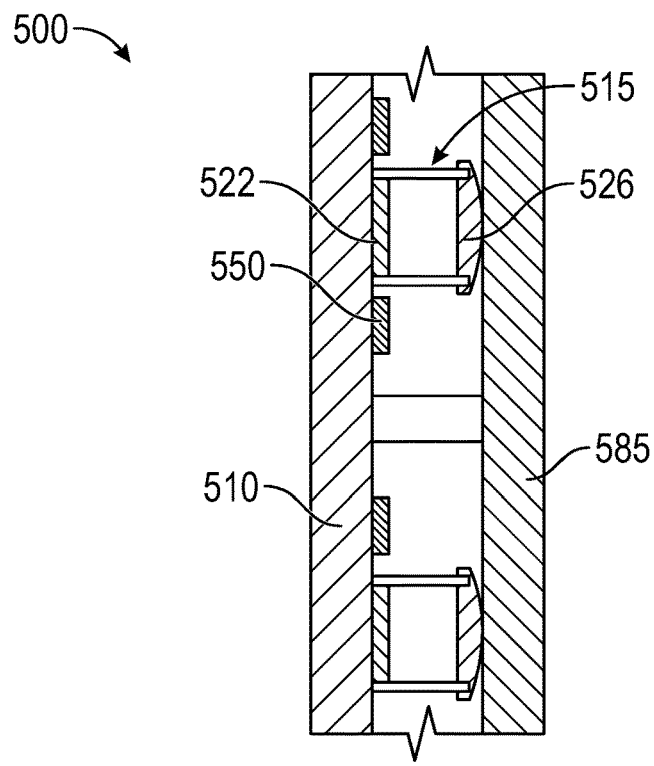
FIG. 14 is a schematic partial side view of yet another alternative illustrative display and image-capture device, in accordance with aspects of the present disclosure.
Figure 15:
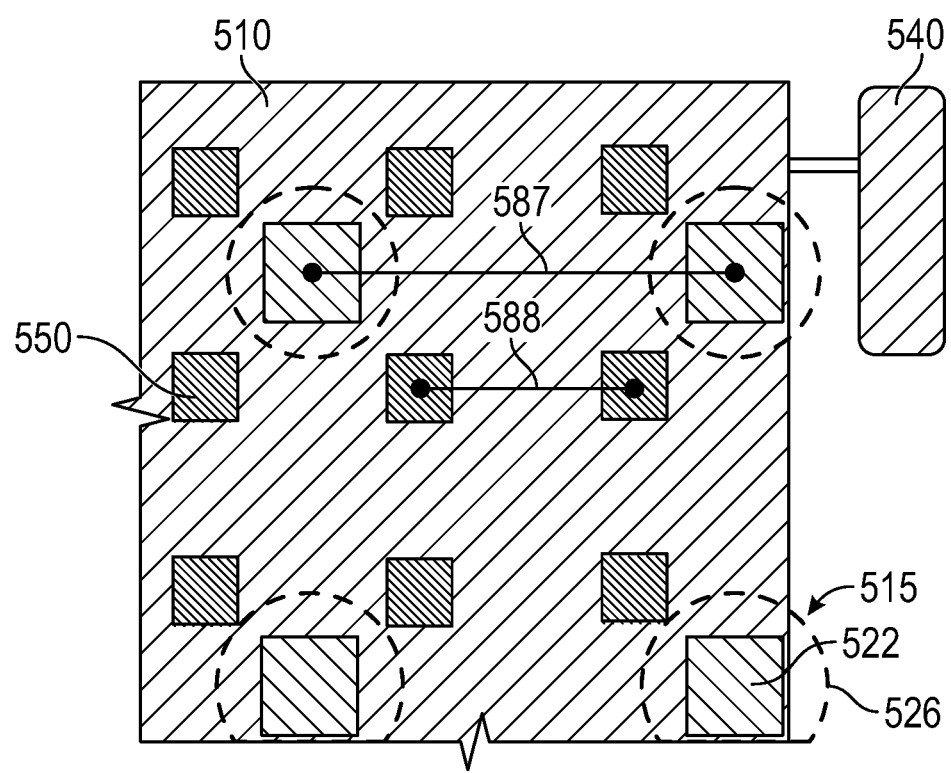
FIG. 15 is a schematic partial top view of the device of FIG. 14.

This section describes yet another illustrative device 500 configured for display and image capture according to the present teachings. In some respects, device 500 is substantially similar to device 100 and to device 300. Accordingly, as shown in FIGS. 14-15, device 500 includes a substrate 510. A plurality of microcameras 515 are disposed on substrate 510. Each microcamera 515 includes an image sensor 522 and a microcamera lens 526 configured to direct incident light onto the image sensor. In some examples, microcamera lens 526 is attached to image sensor 522 (e.g., to a die and/or other suitable support structure of the image sensor). For example, microcamera lens 526 and image sensor 522 may be packaged together as a microcamera chip.

Device 500 further includes at least one electronic controller 540 and a plurality of light-emitting elements 550 disposed on the substrate. Electronic controller 540 is configured to receive image data related to light incident on image sensor 522 of microcamera 515, and to transmit display signals to light-emitting elements 550. Electronic controller 540 may be further configured to transmit to microcameras 515 signals configured to switch an image-sensing mode of the microcameras, as described above with reference to device 100. Device 500 may further include one or more processing circuits configured to receive and process image data from a subset of microcameras 515, and to transmit the processed data to electronic controller 540.

At least one protective layer 585 may be disposed on a light-incident side of the plurality of microcameras 515 to protect the microcameras, light-emitting elements 550, and other components. Protective layer 585 is typically a substantially optically transparent protective layer overlying microcameras 515 and light-emitting elements 550. Protective layer 585 may be configured to protect underlying components from dust and other debris, from impact, from liquid and/or condensation, and/or the like.

Typically, each microcamera 515 is optically isolated from other microcameras. Accordingly, light incident on one of the lenses 526 can typically be directed onto only the corresponding image sensor 522 of the same microcamera 515, rather than onto the image sensor of a neighboring microcamera. For example, the imaging properties of lens 526 and the dimensions of microcamera 515 may be configured such that substantially no light incident on the lens can reach any other microcamera. This configuration may be enabled by manufacturing microcamera 515 as an integral chip. In contrast, this configuration may not be achievable in example devices that are fabricated by attaching image-sensor dies to a substrate and subsequently attaching lenses (e.g., a microlens array) to the device. Accordingly, a field-stop layer is typically unnecessary in device 500. However, it is possible to include a field-stop layer in device 500.

In the example shown in FIGS. 14-15, microcameras 515 are distributed more sparsely on substrate 510 than are light-emitting elements 550. Microcamera pitch 587 (e.g., a distance between the centers of adjacent microcameras) is greater than light-emitting element pitch 588. In some examples, light-emitting element pitch 588 is less than 1 millimeter (e.g., 0.8 millimeters, or less). The width (e.g., diameter) of microcamera lenses 526 is typically small enough, relative to light-emitting element pitch 588, that light emitted by light-emitting elements 550 is not blocked by microcameras 515. For example, lenses 526 may have diameters in the range 200-600 microns (e.g., 300 microns).

Figure 16:
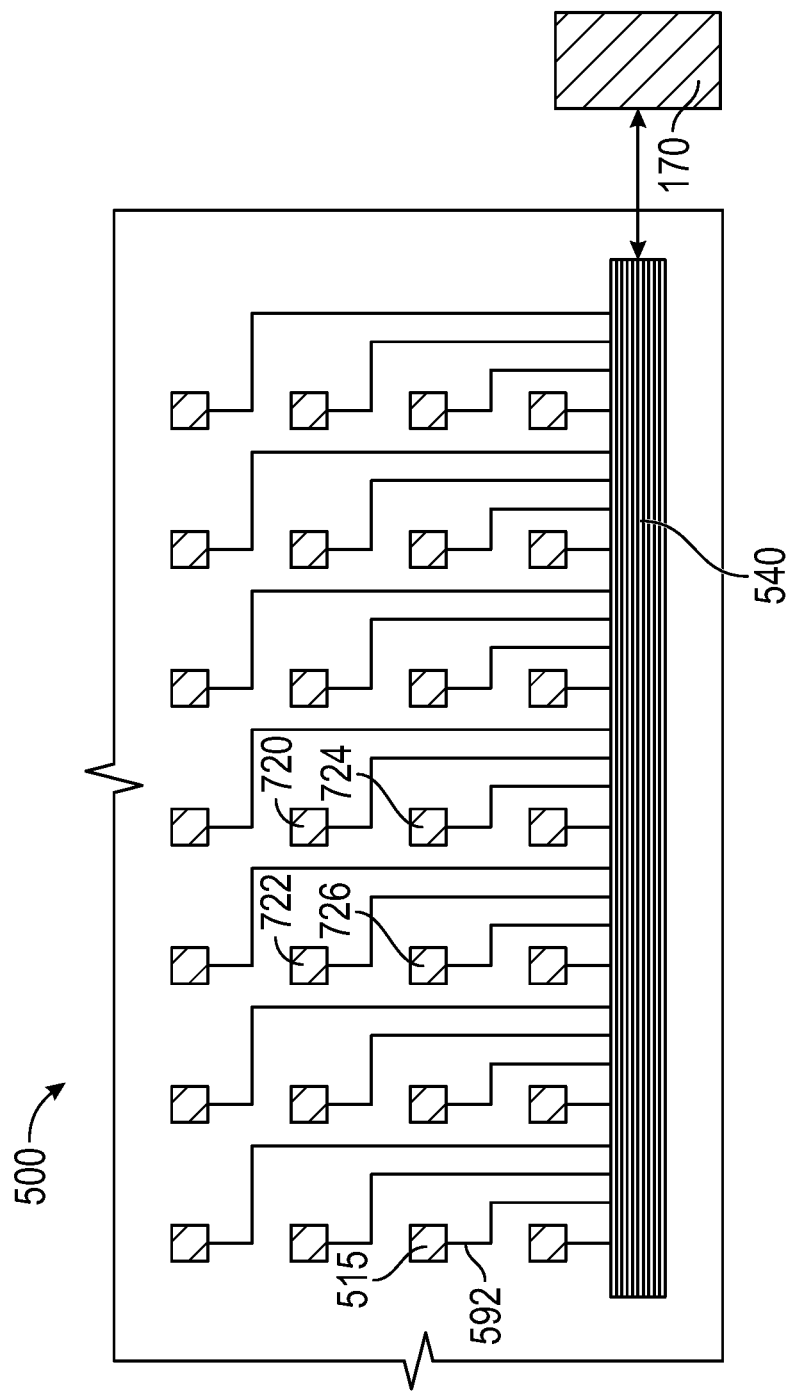
FIG. 16 is a schematic partial top view of the device of FIG. 14, depicting electrical conductors connecting microcameras of the device to an electronic controller.

As shown in FIG. 16, one consequence of the relatively high microcamera pitch 587 is that that electrical conductors 592 can be configured to connect each microcamera 515 directly to electronic controller 540. The individual connection of microcameras 515 to electronic controller 540 may enable device 500 to operate with greater speed, and/or may increase control of the relative timing of operation of microcameras on different parts of substrate 510. In contrast, in examples in which microcamera pitch 587 is smaller, there may not be enough space on the substrate for the number of conductors necessary to directly connect individual image sensors to the controller.

Figure 17:
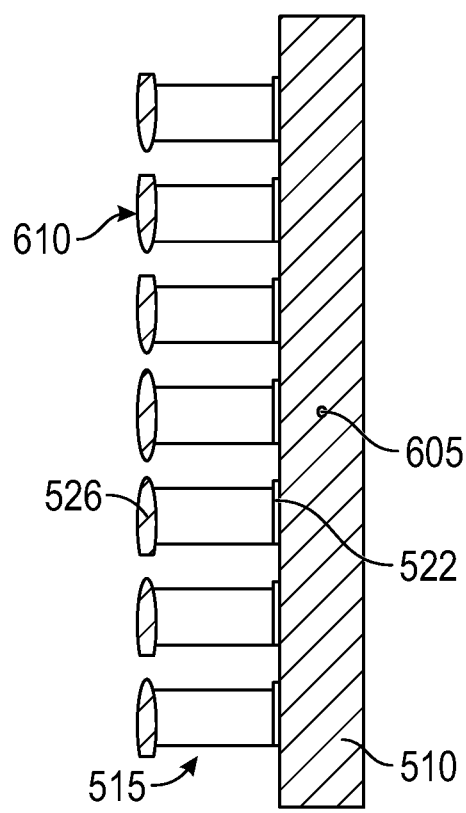
FIG. 17 is a schematic side view depicting illustrative lens surface profiles of the device of FIG. 14.

In some examples, lenses 526 have a different shape based on the position of the corresponding microcamera 515 on substrate 510. FIG. 17 is a schematic side view of device 500 depicting illustrative microcameras 515 disposed at a plurality of distances from a central point 605 of substrate 510. In this example, lenses 526 are aspheric lenses, and each lens has a surface profile 610 that depends on the distance of the lens from central point 605. Lenses 526 of microcameras 515 disposed far from central point 605 (e.g., near edges of substrate 510) may have respective surface profiles 610 configured to extend the field of view of device 500 beyond the edges of the substrate. For example, surface profiles 610 of lenses 526 disposed near a bottom edge of substrate 510 may be configured to direct light onto an upper region of the corresponding image sensors 522. In some examples, the optic axis of each lens 526 is tilted (e.g., relative to an axis normal to substrate 510) by an amount that depends on the distance from the lens to central point 605; the farther the lens is from the central point, the greater the tilt amount.

Device 500 may take the form of a display screen suitable for use in a conference room, classroom, and/or the like. For example, device 500 may comprise a monitor having a diagonal extent of 80 inches or greater (e.g., 86 inches).

D. Illustrative Resolution Enhancement

Display and image-capture devices in accordance with the present teachings may be configured to capture image data suitable for enhancement using image-processing techniques. This section describes an illustrative resolution enhancement for increasing the resolution of images obtained by the device beyond a resolution obtainable without processing. Unless otherwise specified, the term "resolution" as used herein refers to the minimum spot size resolvable by a device or device component. Accordingly, the term "resolution enhancement" refers to a reduction in the minimum resolvable spot size. For clarity, the resolution enhancement process is described here with reference to illustrative device 500 having microcameras 515, but substantially similar resolution enhancement may be performed using any device in accordance with the present teachings.

Figure 18:
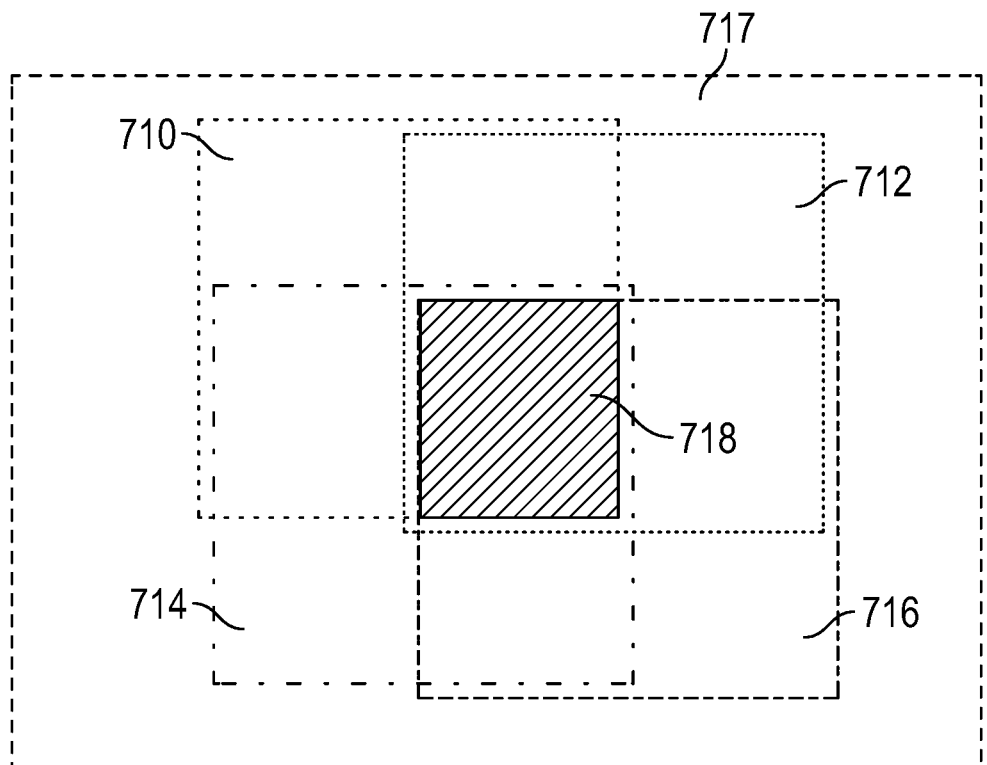
FIG. 18 is a schematic view depicting illustrative overlapping fields of view of microcameras of the device of FIG. 14, in accordance with aspects of the present teachings.

Microcameras 515 may be configured to have overlapping fields of view. FIG. 18 schematically depicts projections of overlapping fields of view 710, 712, 714, and 716 onto an example object plane 717. Fields of view 710-716 all overlap each other in an overlap region 718 of object plane 717. These fields of view correspond to respective microcameras 720, 722, 724, and 726, labeled in FIG. 16. In general, all microcameras 515 are arranged on substrate 510 such that nearly all portions of the scene imageable by device 500 lie within a similar overlap region for a large range of object planes (e.g., for object planes at substantially any distance from the device).

Overlap region 718 is located in a portion of object plane 717 where fields of view 710-716 overlap, and therefore the overlap region is imaged by microcameras 720-726.

That is, microcameras 720-726 all receive light from overlap region 718 and therefore all record image data corresponding to that portion of object plane 717. Because overlap region 718 is imaged by more than one microcamera, the overlap region may be said to be oversampled by device 500. Image-processing algorithms may be used to produce an image of the oversampled overlap region 718 of object plane 717 that has a higher resolution and signal-to-noise ratio than the image data obtained by any one of microcameras 720-726. Suitable image processing techniques may include super-resolution algorithms based on Bayesian estimation (e.g., Bayesian multi-channel image resolution), deep convolutional networks, and/or any other suitable algorithms. In some cases, the image-processing techniques include deconvolution techniques configured to improve image quality by reversing degradation, distortion, and/or artifacts induced by the measurement process; an example is discussed in the next section.

A resolution-enhanced image of each overlap region 718 on object plane 717 is produced by electronic controllers and/or processing circuits of the device. The resolution-enhanced images are typically stitched together at image edges to produce a resolution-enhanced image of the entire scene (e.g., the entire portion of the object plane lying within the field of view of the device). As shown in FIG. 18, regions of partial overlap may extend beyond overlap region 718, which may facilitate accurate alignment of the resolution-enhanced images when the resolution-enhanced images are stitched together.

Typically, when the device is operating in plenoptic mode, it simultaneously collects image data corresponding to a plurality of object planes. Accordingly, resolution-enhancement may be performed for images corresponding to a plurality of object planes. This may allow for techniques associated with the plenoptic function to be performed using resolution-enhanced data. Image processing for a plurality of overlap regions and/or object planes may be performed in parallel by processing circuits disposed on the substrate. Parallel processing techniques may be used to enable image processing for the entire object plane (or plurality of object planes) to be performed relatively quickly, so that the device can produce resolution-enhanced images at an acceptable frame rate.

Image-processing techniques based on oversampling, as described above, may effectively increase device sensitivity as well as device resolution. Oversampling increases device sensitivity because light from a single region (e.g., overlap region 718) is recorded by more than one microcamera. Accordingly, a signal-to-noise ratio associated with the device may be enhanced.

E. Illustrative Data Flow

This section describes an illustrative system for sending data to and from image-sensor dies and light-emitting dies of a display and image-capture device, in accordance with aspects of the present teachings. For clarity, the data flow system is described below with reference to device 100; however, the data flow system may be applied to any suitable device.

As described above with reference to FIG. 2, electrical conductors 130 disposed on substrate 110 are configured to communicate data between electronic controller 140 and image-sensor dies 120, and between the electronic controller and light-emitting dies 150. Adequate performance of device 100 may depend on the timing of data communications within the device. For example, if video data is to be displayed using light-emitting dies 150 as video pixels, then the light-emitting dies typically must be configured to respond to display signals at substantially the same time. If video data is to be recorded using image-sensor dies 120, then the image-sensor dies typically must produce image data in a synchronized way. However, control over the timing of data communications within device 100 is typically subject to several constraints. For example, the speed at which data is able to travel from a first location on device 100 to a second location may be limited by the length of electrical conductor 130 that connects the two devices, and/or by the amount of data that may be transferred by the conductor in a given time interval. The amount of data being transferred, and therefore the time necessary for the data transfer, may depend on the extent of photosensor region 125 from which processing circuits 165 receive data. A data set corresponding to only a subset 200 of pixels 160, for example, is typically smaller than a data set corresponding to the entire pixel array. Accordingly, device 100 may have a lower video-capture frame rate when operating in a plenoptic camera mode than when operating in a conventional camera mode. The maximum achievable frame rates of video capture and video display, however, may be limited by the number of electrical conductors 130 that can fit on substrate 110. These timing considerations, among others, may at least partially determine the flow of data within device 100.

FIG. 2 depicts an example of device 100 in which image-sensor dies 120 and light-emitting dies 150 are disposed in rows and columns on substrate 110. In this example, electrical conductors 130 are configured to electrically connect the image-sensing dies 120 in each row to each other, and to electrically connect each row to electronic controller 140. Similarly, electrical conductors 130 are configured to electrically connect the light-emitting dies 150 in each row to each other, and to electrically connect each row to electronic controller 140. In other examples, electrical conductors 130 may additionally or alternatively connect image-sensing dies 120 (or light-emitting dies 150) in each column to each other, and to electrically connect each column to electronic controller 140. In yet other examples, individual image-sensing dies 120 and/or light-emitting dies 150 may each be directly connected to electronic controller 140; see FIG. 16 and associated description.

Electronic controller 140 may be configured to send a trigger signal to each row of image-sensor dies 120. The trigger signal may be configured to cause each image-sensor die 120 in the row to begin measuring incident light (e.g., to begin an exposure time, to open hardware and/or software shutters, and so on), either immediately or within a predetermined time interval. The interval may be based on the position of the die within the row, such that each die in the row begins measurement at substantially the same time. Electrical conductors 130 may be distributed on substrate 110 in any configuration suitable to facilitate this system. Electronic controller 140 may similarly be configured to send display signals to each row or column of light-emitting dies 150.

Processing circuits 165 may be configured to read and/or process data from image-sensor dies 120 in each row to produce a respective set of row data corresponding to each row, and to transmit the row data from each row to electronic controller 140. In this manner, image data recorded by image-sensor dies 120 within a given row arrive at electronic controller 140 at substantially the same time (e.g., within an acceptable tolerance).

As discussed in the previous section, image data resolution may be improved using resolution-enhancing image-processing techniques, such as deconvolution. In examples in which photosensor regions 125 each comprise a two-dimensional array of pixels 160, deconvolutions may be performed on the image data in the following manner. After image data has been recorded (e.g., after the end of an exposure time of photosensor region 125), the image data is deconvolved vertically (e.g., along each column of pixels 160) and the deconvolution of each column is stored in a data packet. The deconvolved column data for each column of each photosensor region 125 in the row is added to the data packet, and the data packet, now containing data for each column of each photosensor region in the row, is transmitted to electronic controller 140. Performing the vertical deconvolution prior to sending the data to electronic controller 140 reduces the amount of data that must be transferred via electrical conductors 130, and also reduces the amount of data to be processed and the number of operations to be performed by electronic controller 140. Accordingly, the frame rate of the image-capture system may be increased.

After receiving the data packet containing the deconvolved column data, electronic controller 140 may be configured to horizontally deconvolve the data of the data packet (e.g., to deconvolve the data along a dimension corresponding to the rows of pixels 160 of photosensor regions 125). Alternatively, or additionally, the horizontal deconvolution may be performed on each data packet (e.g., by at least one processing circuit 165) before the data packet is sent to the electronic controller.

In some examples, the deconvolution of each column is stored in a predetermined range of bits within the ordered set of bits comprising the data packet. For example, each pixel column within a row of image-sensor dies 120 may be stored in a respective unique range of bits. Alternatively, the deconvolution of each pixel column may be added to a respective predetermined range of bits that partially overlaps with ranges of bits corresponding to at least one other pixel column. For example, if each photosensor region 125 includes n columns, then the deconvolution of each column of the first photosensor region in a row may be stored in the first n bit positions of the data packet, e.g., in bit positions labeled 0 through n−1. The deconvolution of each column of the second photosensor region (that is, the photosensor region adjacent the first region) in the same row may be stored in bit positions 1 through n, and so on. At bit positions where data from a previous photosensor region is already stored, the data of the present column is added to the existing data. In this manner, a data packet including deconvolved data from each column of each photosensor region 125 in the row is created, and the number of bit positions in at least one dimension of the data packet corresponds to the number of photosensor regions in the row. Other dimensions of the data packet may correspond to a number of color components (e.g., red, green, and blue color components) and/or to a pixel resolution and/or dynamic range for the deconvolved data.

In some examples, a selected subset of image-sensor dies 120 may be configured to operate with a faster frame rate than other image-sensor dies. For example, electronic controller 140 may be configured to send trigger signals to a selected subset of rows more frequently than to other rows. This allows selected portions of device 100 to capture image data at a higher frame rate than other portions. For example, electronic controller 140 and/or data-processing system 170 may be configured to detect that image data from a first subset of image-sensor dies 120 changes significantly from frame to frame, whereas image data from a second subset of image-sensor dies changes little from frame to frame. The controller and/or data processing system may therefore trigger the readout of image data from rows including image-sensor dies 120 of the first subset at a faster rate than data from rows including dies of the second subset.

F. Illustrative Combinations and Additional Examples

This section describes additional aspects and features of display and image-capture devices, presented without limitation as a series of paragraphs, some or all of which may be alphanumerically designated for clarity and efficiency. Each of these paragraphs can be combined with one or more other paragraphs, and/or with disclosure from elsewhere in this application, including the materials incorporated by reference in the Cross-References, in any suitable manner. Some of the paragraphs below expressly refer to and further limit other paragraphs, providing without limitation examples of some of the suitable combinations.

A. A device comprising a substrate generally defining a plane; a plurality of electrical conductors disposed on the substrate; a plurality of image sensor dies disposed on the substrate, each image sensor die including a photosensor region; a plurality of light emitting dies disposed on the substrate, each light emitting die including a light emitting region; at least one electronic controller configured, through the electrical conductors, to transmit mode signals to the image sensor dies, receive image data from the image sensor dies, and transmit display signals to the light emitting dies; and a power source configured, through the electrical conductors, to provide the power to the image sensor dies and the light emitting dies.

A1. The device of paragraph A, further comprising a plurality of microlenses disposed in a microlens array layer on a light-incident side of the image sensor dies, wherein each microlens is configured to focus incident light on an associated one of the photosensor regions.

A2. The device of paragraph A1, further comprising a field stop layer disposed between the microlens array layer and the image sensor dies, wherein the field stop layer includes a patterned mask configured to prevent light focused by each microlens from reaching any of the photosensor regions other than the photosensor region associated with each microlens.

A3. The device of any one of paragraphs A through A2, wherein the light emitting regions each include a microLED.

A4. The device of any one of paragraphs A through A3, wherein each photosensor region includes a plurality of image sensing pixels arranged in a two-dimensional array.

A5. The device of paragraph A4, wherein each image sensor die includes a processing circuit configured to receive image data from the photosensor region, to process the image data received from the photosensor region, and to transmit the processed image data to the electronic controller.

A6. The device of paragraph A5, wherein the processing circuits of the image sensing dies are configured to receive commands from the controller, including commands to switch image sensing modes.

A7. The device of any one of paragraphs A5 through A6, wherein the processing circuits of the image sensing dies are configured, in response to a signal received from the controller, to process and transmit image data corresponding only to a subset of the image sensing pixels of the image sensing die associated with each processing circuit.

A8. The device of paragraph A7, wherein the subset of the image sensing pixels depends on a location of the associated image sensing die on the substrate.

A9. The device of any one of paragraphs A through A8, wherein the substrate is a monitor display screen.

B. A device comprising a substrate generally defining a plane; a plurality of image sensor dies disposed on the substrate, each image sensor die including a photosensor region; a plurality of lenses disposed on a light-incident side of the image sensor dies, wherein each of the lenses is configured to direct light impinging on a front surface of the lens toward a predetermined one of the photosensor regions based on an angle of incidence between the impinging light and the front surface of the lens; a plurality of light emitting dies disposed on the substrate, each light emitting die including a light emitting region; and at least one electronic controller configured to transmit mode information to the image sensor dies, receive image data from the image sensor dies, and transmit display signals to the light emitting dies.

B1. The device of paragraph B, wherein each photosensor region includes a two-dimensional array of image sensing pixels and wherein each image sensor die includes a processing circuit configured to receive image data from the pixels, to process the image data, and to transmit the processed image data to the electronic controller.

B2. The device of paragraph B1, wherein the processing circuits are configured to switch image sensing modes based on a signal received from the controller.

B3. The device of any one of paragraphs B1 through B2, wherein the processing circuit of each image sensor die is configured to selectively process and transmit image data corresponding only to a subset of the pixels of the image sensing die, based on a signal received from the controller.

B4. The device of paragraph B3, wherein the subset of the image sensing pixels depends on a location of the associated image sensing die on the substrate.

B5. The device of any one of paragraphs B through B4, further comprising a plurality of microlenses including one microlens disposed on a light-incident side of each image sensor die and configured to focus incident light on the photosensor region of the image sensor die.

B6. The device of paragraph B5, further comprising a field stop layer disposed between the microlenses and the image sensor dies, wherein the field stop layer is configured to inhibit light focused by each microlens from reaching more than one photosensor region.

C. A camera display system comprising a substrate generally defining a plane; a plurality of micro-cameras disposed on the substrate, each of the micro-cameras including an image sensor and a lens configured to direct incident light onto the image sensor; an array of light-emitting elements disposed on the substrate; a substantially optically transparent protective layer overlying the micro-cameras and the light-emitting elements; and at least one electronic controller configured to receive image data from the incident light and transmit display signals to the light-emitting elements.

C1. The system of paragraph C, wherein the lenses are aspheric, and wherein each lens has a surface profile which depends on a distance of the lens from a central point of the substrate.

C2. The system of any one of paragraphs C through C1, wherein the camera display system is a touch-sensitive monitor display.

Advantages, Features, and Benefits

The different embodiments and examples of the display and image-capture device described herein provide several advantages over known solutions for providing display and image-capture functions on the same device. For example, illustrative embodiments and examples described herein allow for videoconferencing with reduced gaze parallax, and/or substantially without gaze parallax.

Additionally, and among other benefits, illustrative embodiments and examples described herein allow for an image-capture system having a field of view, effective aperture size, focal distance, and depth of focus that are programmatically adjustable. Accordingly, these properties can be adjusted to suit a particular application and/or location by software commands, rather than changes to hardware.

Additionally, and among other benefits, illustrative embodiments and examples described herein allow for an image-capture and display device in which the light-emitting dies that comprise display pixels occupy only a small fraction of the area of the device (relative to known devices). Accordingly, the device has more room for image sensors and/or other devices. The device display also has higher contrast due to the increased space between display pixels.

Additionally, and among other benefits, illustrative embodiments and examples described herein allow a plenoptic camera having no objective lens. For example, the plenoptic camera can be a flat-panel camera.

Additionally, and among other benefits, illustrative embodiments and examples described herein allow for a flexible flat-panel camera and display device. The flexible flat-panel form factor allows the device to be stored and transported more easily. This may allow for a device that is larger than existing rigid camera and display devices. For example, the size of rigid devices is typically limited by the need to fit into an elevator, whereas flexible embodiments described herein may be rolled to fit into an elevator and/or other small space. For at least this reason, illustrative embodiments and examples described herein allow for a display and image-capture device that is larger than known devices.

Additionally, and among other benefits, illustrative embodiments and examples described herein allow for an image-capture and display device that is lighter in weight and consumes less power than known devices.

Additionally, and among other benefits, illustrative embodiments and examples described herein allow for an image-capture and display device that can be manufactured in according to cost-effective methods. For example, the image-sensor dies and/or light-emitting dies may be attached to and/or formed on the substrate using cost-effective roll-based transfer technology.

No known system or device can perform these functions. However, not all embodiments and examples described herein provide the same advantages or the same degree of advantage.

CONCLUSION

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. A camera display system comprising:
a substrate generally defining a plane;
a plurality of micro-cameras disposed on the substrate, each of the micro-cameras including an image sensor and a lens configured to direct incident light onto the image sensor;
an array of light-emitting elements disposed on the substrate; and
at least one electronic controller in electrical communication with the plurality of micro-cameras via one or more electrical conductors, wherein the at least one electronic controller is configured to receive data based on the incident light via the one or more electrical conductors and transmit display signals to one or more transistors to regulate current flow to the light-emitting elements, and wherein the display signals are configured to cause the light-emitting elements to emit light having a selected intensity and a selected color.

2. The system of claim 1, wherein two or more of the micro-cameras have overlapping fields of view, and the at least one electronic controller is configured to generate resolution-enhanced image data based on received data corresponding to the two or more micro-cameras having overlapping fields of view.

3. The system of claim 1, wherein the camera display system functions as a touch-sensitive display of a mobile device, computer, television, tablet, or interactive display.

4. The system of claim 2, wherein generating the resolution-enhanced image data includes using a super-resolution technique.

5. The system of claim 4, wherein the resolution-enhanced image data comprises an image having a higher signal-to-noise ratio than an image corresponding to a single one of the two or more micro-cameras.

6. The system of claim 2, wherein generating the resolution-enhanced image data includes using a deconvolution technique.

7. The system of claim 1, wherein the at least one electronic controller is further configured to process the data received by the at least one electronic controller.

8. The system of claim 7, wherein processing the data received by the at least one electronic controller includes generating, based on the data received by the at least one electronic controller, one or more images each having a resolution higher than a resolution corresponding to an individual one of the plurality of micro-cameras.

9. The system of claim 7, wherein processing the data received by the at least one electronic controller includes generating, based on the data received by the at least one electronic controller, a plenoptic image.

10. The system of claim 7, wherein processing the data received by the at least one electronic controller includes determining information about at least one object touching or hovering over the camera display system.

11. The system of claim 7, wherein processing the data received by the at least one electronic controller includes generating, based on the data received by the at least one electronic controller, one or more images each having a respective number of pixels higher than a number of pixels of an image corresponding to an individual one of the plurality of micro-cameras.

12. The system of claim 7, wherein the at least one electronic controller is further configured to transmit processed data to an external device.

13. The system of claim 1, further comprising one or more processors disposed on the substrate, wherein each of the one or more processors is in electrical communication with at least one of the micro-cameras, and wherein the at least one electronic controller is configured to receive the data based on the incident light, via the one or more electrical conductors, from the one or more processors.

14. The system of claim 13, wherein the one or more processors are configured to perform an image-processing operation on the data based on the incident light before the data based on the incident light is received by the at least one electronic controller.

* * * * *